US010256253B2

(12) United States Patent
Li

(10) Patent No.: US 10,256,253 B2
(45) Date of Patent: Apr. 9, 2019

(54) ARRAY SUBSTRATE, DISPLAY DEVICE AND WEARABLE APPARATUS

(71) Applicant: BOE TECHNOLOGY GROUP CO., LTD., Beijing (CN)

(72) Inventor: Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/308,761

(22) PCT Filed: Feb. 15, 2016

(86) PCT No.: PCT/CN2016/073793
§ 371 (c)(1),
(2) Date: Nov. 3, 2016

(87) PCT Pub. No.: WO2017/036095
PCT Pub. Date: Mar. 9, 2017

(65) Prior Publication Data
US 2017/0263648 A1 Sep. 14, 2017

(30) Foreign Application Priority Data
Sep. 6, 2015 (CN) .......................... 2015 1 0561286

(51) Int. Cl.
H01L 29/04 (2006.01)
H01L 27/12 (2006.01)
(Continued)

(52) U.S. Cl.
CPC .... H01L 27/1214 (2013.01); G02F 1/136286 (2013.01); G02F 2201/56 (2013.01); G04G 9/06 (2013.01)

(58) Field of Classification Search
CPC ........ H01L 27/1214–27/1296; H01L 27/3248; H01L 27/3276–27/3279; H01L 27/3297; G02F 1/1362–2001/13685
See application file for complete search history.

(56) References Cited

U.S. PATENT DOCUMENTS

2009/0002609 A1* 1/2009 Okita .................. G02F 1/13363
349/98
2014/0253419 A1 9/2014 Tanada
2016/0225306 A1* 8/2016 Shin ..................... G09G 3/2092

FOREIGN PATENT DOCUMENTS

CN 105137684 A 12/2015
CN 204883134 U 12/2015
(Continued)

OTHER PUBLICATIONS

First Office Action for Chinese Application No. 201510561286.5, dated Aug. 10, 2017, 6 Pages.
(Continued)

Primary Examiner — Kevin M Picardat
(74) Attorney, Agent, or Firm — Brooks Kushman P.C.

(57) ABSTRACT

The present disclosure discloses that an array substrate, including a base substrate having a circular or oval horizontal section, wherein the base substrate comprises a display region and a non-display region, wherein a plurality of first signal lines, a plurality of second signal lines crossing the plurality of first signal lines, a plurality of thin film transistors and a plurality of pixel electrodes are arranged in the display region, and the plurality of thin film transistors and the plurality of pixel electrodes are arranged in a plurality of pixel regions defined by the plurality of first signal lines and the plurality of second signal lines, wherein a connection wire connected to the plurality of first signal lines and the plurality of second signal lines is arranged in the non-display region.

16 Claims, 7 Drawing Sheets

(51) Int. Cl.
*G02F 1/1362* (2006.01)
*G04G 9/06* (2006.01)

(56) References Cited

FOREIGN PATENT DOCUMENTS

| | | |
|---|---|---|
| JP | H02135425 A | 5/1990 |
| JP | 2009145368 A | 7/2009 |
| TW | 201035938 A | 10/2010 |

OTHER PUBLICATIONS

International Search Report and Written Opinion for Application No. PCT/CN2016/073793, dated May 27, 2016, 11 Pages.

\* cited by examiner

ARRAY SUBSTRATE, DISPLAY DEVICE AND WEARABLE APPARATUS

CROSS-REFERENCE TO RELATED APPLICATIONS

This application is the U.S. national phase of PCT Application No. PCT/CN2016/073793 filed on Feb. 15, 2016, which claims priority to Chinese Patent Application No. 201510561286.5 filed on Sep. 6, 2015, the disclosures of which are incorporated in their entirety by reference herein.

TECHNICAL FIELD

The present disclosure relates to the field of display technology, and in particular, to an array substrate, a display device and a wearable apparatus.

BACKGROUND

Due to various requirements of people on their lives and creative modification continuously made by researchers to products, liquid crystal display technologies are developing. Nowadays, wearable display technologies develop quickly and wearable smart watches emerge abundantly. Dials of conventional wearable smart watches are usually designed into rectangles. Some wearable smart watches are provided with circular dials, however, the pixels are stilled rectangular as in conventional technologies.

SUMMARY

An object of the present disclosure is to provide an array substrate, a display device and a wearable apparatus, so as to solve the technical problem that no pixel structures are designed for circular display in conventional technologies.

For achieving the above object, in a first aspect, the present disclosure provides an array substrate, including a base substrate having a circular or oval horizontal section, wherein the base substrate comprises a display region and a non-display region, wherein a plurality of first signal lines, a plurality of second signal lines crossing the plurality of first signal lines, a plurality of thin film transistors and a plurality of pixel electrodes are arranged in the display region, and the plurality of thin film transistors and the plurality of pixel electrodes are arranged in a plurality of pixel regions defined by the plurality of first signal lines and the plurality of second signal lines; wherein a connection wire connected to the plurality of first signal lines and the plurality of second signal lines is arranged in the non-display region; wherein each of the plurality of first signal lines comprises a first portion and a second portion, the first portion is a circular arc or an oval arc and the second portion is configured to connect the first portion to the connection wire; and wherein the first portions of the plurality of first signal lines are arranged concentrically, and each of the plurality of second signal lines extends from a point at an outer edge of the display region to a central region of the base substrate.

Alternatively, the first portions of the plurality of first signal lines are distributed at an identical interval; or a distribution density of the first portions of the plurality of first signal lines is gradually increased in a direction from a center to a periphery of the base substrate.

Alternatively, the first portions and the second portions of the plurality of first signal lines are created from an identical layer, and the second portion of one first signal line passes through openings of circular arcs or oval arcs of other first signal lines located closer to the non-display region than the one first signal line and is then connected to the connection wire, wherein the openings are located at a side of the non-display region.

Alternatively, the first portion of each of the first signal lines in addition to the first signal line farthest from the non-display region is a circular arc or an oval arc having an opening.

Alternatively, the openings of the first portions of the first signal lines are arranged at positions corresponding to each other.

Alternatively, the first portion and the second portion of each of the plurality of first signal lines are arranged at different layers, insulated from each other, and connected to each other through a via-hole.

Alternatively, each of the plurality of second signal lines extends from a point at the outer edge of the display region to the center of the base substrate.

Alternatively, the plurality of second signal lines is distributed evenly.

Alternatively, in the pixel regions between any two adjacent second signal lines, areas of the pixel electrodes are gradually increased in a direction from the center to the periphery of the base substrate.

Alternatively, each of the plurality of pixel electrodes is a circular, oval or near-quadrilateral shape.

Alternatively, in the case that each of the plurality of pixel electrodes is of a near-quadrilateral shape, the near-quadrilateral shape comprises a first edge and a third edge opposite to each other, and a second edge and a fourth edge opposite to each other, wherein the first edge and the third edge are arcs and are concentric with the first signal lines adjacent to the first edge and the third edge, the second edge and the fourth edge are straight and are respectively parallel to the second signal lines adjacent to the second edge and the fourth edge.

Alternatively, the non-display region is located in a central region of the array substrate and the display region is located at the periphery of the non-display region.

Alternatively, the non-display region is located in a peripheral region of the array substrate and the display region is surrounded by the non-display region.

In a second aspect, the present disclosure further provides a display device, including the above array substrate.

In a third aspect, the present disclosure further provides a wearable apparatus, including the above display device.

The embodiments of the present disclosure have at least the following beneficial effects. In the array substrate, one type of signal lines are designed into circular arcs or oval arcs and another type of signal lines are radiated from the central region of the base substrate to the periphery. Such array substrate is suitable for circular or oval display devices.

BRIEF DESCRIPTION OF THE DRAWINGS

In order to describe technical solutions according to embodiments of the present disclosure and the related technologies more clearly, drawings to be used in descriptions of the embodiments or the related technologies are briefly introduced. Obviously, the described drawings are merely for a part of the embodiments of the present disclosure. The ordinary skilled in the art may obtain other drawings based on these described drawings without inventive efforts.

DETAILED DESCRIPTION

Drawings are provided to further illustrate specific implementations of the present disclosure in association with the embodiments, and the present disclosure is merely described but not limited by the following described embodiments.

For clarifying objectives, technical solutions and advantages of the present disclosure, the technical solutions are described clearly and completely in conjunction with drawings and embodiments. Apparently, the described embodiments are merely a part of, rather than all of, the embodiments. Any other embodiment obtained by those skilled in the art based on the embodiments of the present disclosure shall fall within the scope of the present disclosure.

Unless other definitions are given, technical terms or scientific terms used herein refer to normal meanings which can be understood by the ordinary skilled in the field to which the present disclosure relates. Terms such as "first" and "second" used in the specification and the list of claims of the present disclosure do not indicate any order, numbers or importance, and are merely used to distinguish different components. Similarly, terms such as "a" or "an" represent there exist at least one, rather than to limit the number. Terms such as "connected with" or "connected to" do not limit to physical or mechanical connections, and can include electrical connections which are either direct or indirect. Terms such as "on/above", "under/below", "left" and "right" are merely used to describe a relative position relationship; if the absolute position of one described object alters, the relative position relationship with respect to the described object alters correspondingly.

Specific implementations of the present disclosure are detailed in conjunction with drawings and embodiments. The following described embodiments are intended to explain, rather than limit, the present disclosure.

First Embodiment

Figure 1:
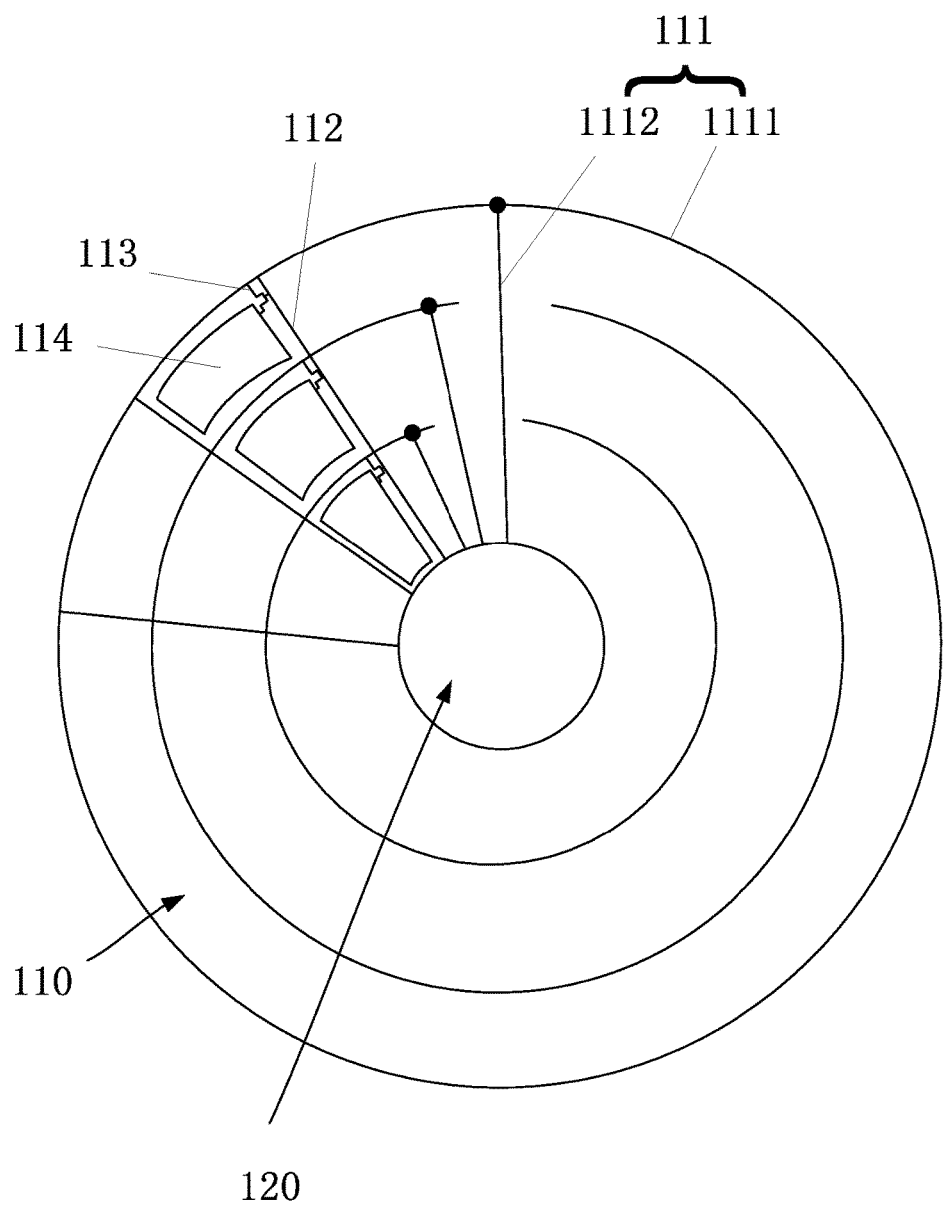
FIG. 1 is a structural schematic diagram of an array substrate according to a first embodiment of the present disclosure.

Referring to FIG. 1, FIG. 1 is structural schematic diagram of an array substrate according to a first embodiment of the present disclosure. The array substrate includes a base substrate having a circular horizontal section. The base substrate includes a display region 110 and a non-display region 120. The non-display region 120 is located in a central region of the base substrate. The display region 110 is located at the periphery of the non-display region 120. Obviously, the array substrate with such structure can achieve a frameless design. Of course, the arrangement of the display region 110 and the non-display region 120 are exemplary rather than determinative. For example, the display region 110 and the non-display region 120 may be arranged in other ways according to needs, which may be described in the following embodiments.

A plurality of first signal lines 111, a plurality of second signal lines 112 crossing the plurality of first signal lines 111, a plurality of thin film transistors (TFTs) 113 and a plurality of pixel electrodes 114 are arranged in the display region 110, and the plurality of thin film transistors (TFTs) 113 and the plurality of pixel electrodes 114 are arranged in a plurality of pixel regions defined by the plurality of first signal lines 111 and the plurality of second signal lines 112. According to the embodiment, the first signal lines 111 are data lines and the second signal lines 112 are gate lines. Here, a TFT 113 and a pixel electrode 114 are provided in each of the pixel regions defined by the intersections of the first signal lines (the data lines) 111 and the second signal lines (the gate lines) 112, the TFT 113 is located near a region where a corresponding first signal line (data line) 111 intersects a corresponding second signal line (gate line) 112. A gate electrode of the TFT 113 is connected to the corresponding second signal line (gate line) 112, a source electrode of the TFT 113 is connected to the first signal line (data line) 111, and a drain electrode of the TFT 113 is connected to the pixel electrode 114. A connection wire connected to the first signal lines 111 and the second signal lines 112 is arranged in the non-display region 120 and the connection wire is configured to connect the first signal lines 111 and the second signal lines 112 to a driver chip.

Each first signal line 111 includes a first portion 1111 and a second portion 1112. The first portion 1111 is a circular arc, and the first portions 1111 of the respective first signal lines 111 are arranged concentrically. The second portion 1112 is straight and is configured to connect the corresponding first portion 1111 to the connection wire. A horizontal section of the base substrate is a circle; alternatively, the first portions 1111 of the respective first signal lines 111 are concentric with the horizontal section of the base substrate, such that an area of the base substrate is sufficiently used.

In the embodiment, the first portion 1111 and the second 1112 of the first signal line 111 are created from an identical layer. Accordingly, the first portion 1111 and the second portion 1112 can be formed by one patterning process, thereby saving the cost. The first signal line 111 is usually made of a metallic material such as copper, aluminum, or appropriate alloys, etc.

In order to prevent the plurality of first signal lines 111 from overlapping each other, in the embodiment, the first portion 1111 of each of the first signal lines 111 in addition to the first signal line 111 farthest from the non-display region 120 (an outmost first signal line 111 according to the embodiment) is a circular arc having an opening, while the first portion 1111 of the first signal line 111 farthest from the non-display region 120 is a complete circular arc (i.e., a whole circle). Of course, in other embodiments of the present disclosure, the first signal line 111 farthest from the non-display region may also have an opening. For each first signal line 111 in addition to the first signal line 111 closest to the non-display region, the second portion 1112 of one first signal line 111 passes through the openings of the circular arcs of the other first signal lines 111 located closer to the non-display region than the one first signal line 111 and is then connected to the connection wire, wherein the openings are located at a side of the non-display region. The openings of the first portions 1111 of the respective first signal lines 111 are arranged at positions corresponding to each other, so as to improve the aperture ratio.

In the embodiment, each second signal line 112 extends from a point at an outer edge of the display region 110 to the center of the base substrate, and the plurality of second signal lines 112 do not cross each other. The outer edge of the display region 110 is a circle, and each second signal line 112 is a part of a radius of the circle, as shown in FIG. 1.

In the embodiment, the first portions 1111 (the circular arcs) of the plurality of first signal lines 111 are distributed at an identical interval. The plurality of second signal lines 112 are evenly distributed in the display region 110. It should be noted that, the first portions 1111 (the circular arcs) of the plurality of first signal lines 111 that are distributed at the identical interval and the plurality of second signal lines 112 that are evenly distributed are exemplary rather than determinative, and the ordinary skilled in the art may arrange the first signal lines 111 and the second signal lines 112 in other ways according to needs such that the first portions 1111 of the first signal lines 111 are not distributed at an identical interval and the plurality of second signal lines 112 are not evenly distributed. A plurality of pixel electrodes 114 are provided between two adjacent second signal lines 112. As shown in FIG. 1, in a direction from the center to the periphery of the base substrate, areas of the plurality of pixel electrodes 114 gradually increase. Of course, the areas of the plurality of pixel electrodes 114 may be arranged substantially the same or may be gradually decreased according to actual needs.

In the embodiment, each pixel electrode 114 has a near-quadrilateral shape. The near-quadrilateral shape includes a first edge and a third edge opposite to each other, and a second edge and a fourth edge opposite to each other. The first edge and the third edge are arcs and are concentric with the first signal lines 111 adjacent to the first edge and the third edge. The second edge and the fourth edge are straight and are respectively parallel to the second signal lines 112 adjacent to the second edge and the fourth edge. With the pixel electrodes 114 having such shape, the aperture ratio of a pixel region can be enhanced sufficiently.

In the array substrate according to the above embodiment, there are the data lines each having circular arcs, the gate lines radiating from the center to the periphery of the base substrate, and the pixel electrodes having shapes matching the data lines and the gate lines, such that the array substrate is easily applied to a circular display device.

Second Embodiment

Figure 2:
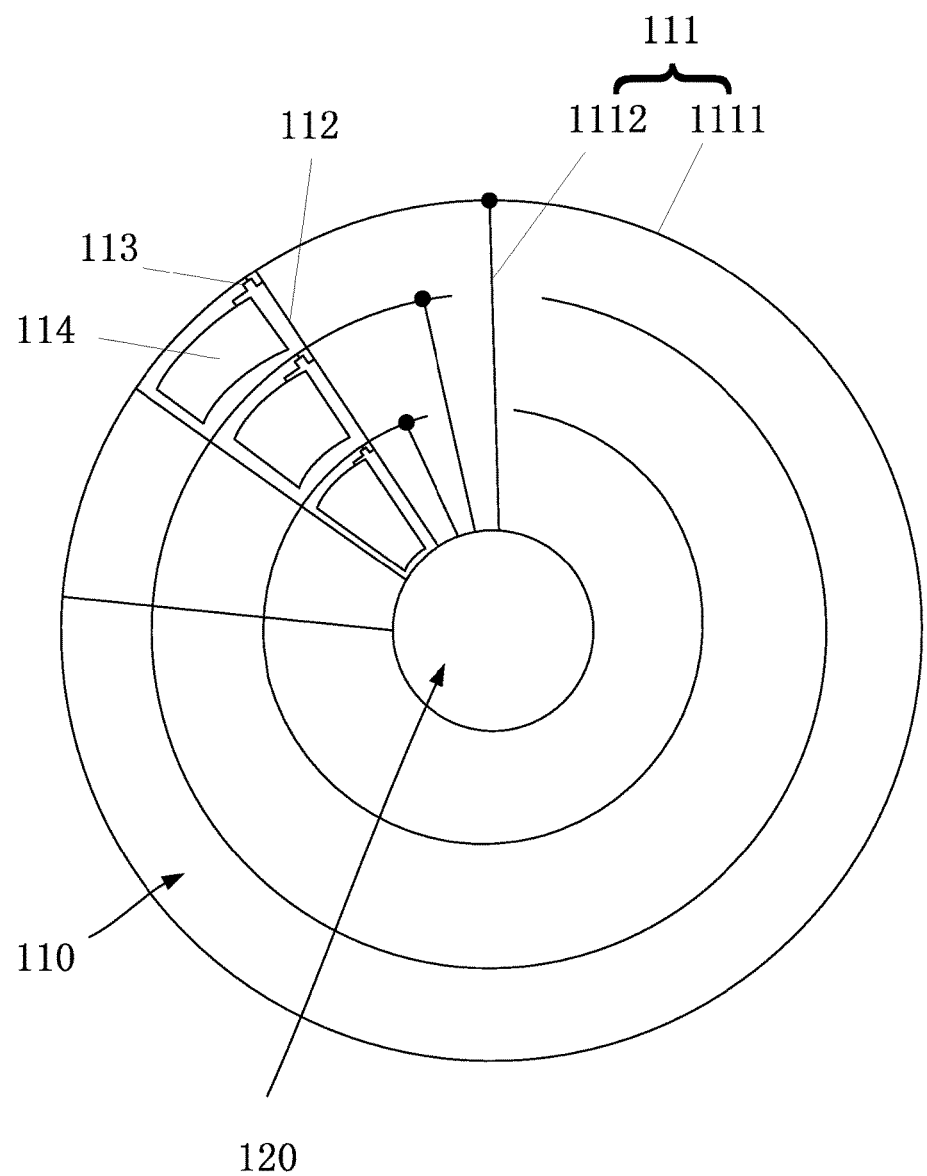
FIG. 2 is a structural schematic diagram of an array substrate according to a second embodiment of the present disclosure.

Referring to FIG. 2, FIG. 2 is a structural schematic diagram of an array substrate according to a second embodiment of the present disclosure. It should be noted that, different from the first embodiment, in the second embodiment, the first signal lines 111 are gate lines and the second signal lines 112 are data lines.

That is to say, in the first embodiment, the data lines each include circular arcs and the gate lines are straight; while in the second embodiment, the gate lines each include circular arcs and the data lines are straight.

It should be noted that, in the second embodiment, features substantially identical to those described in the first embodiment as shown in FIG. 1 are not repeated herein. That is, only differences between the first embodiment and the second embodiment are described, while similar parts can be understood with reference to corresponding descriptions in the first embodiment and are accordingly not described herein.

Third Embodiment

Figure 3:
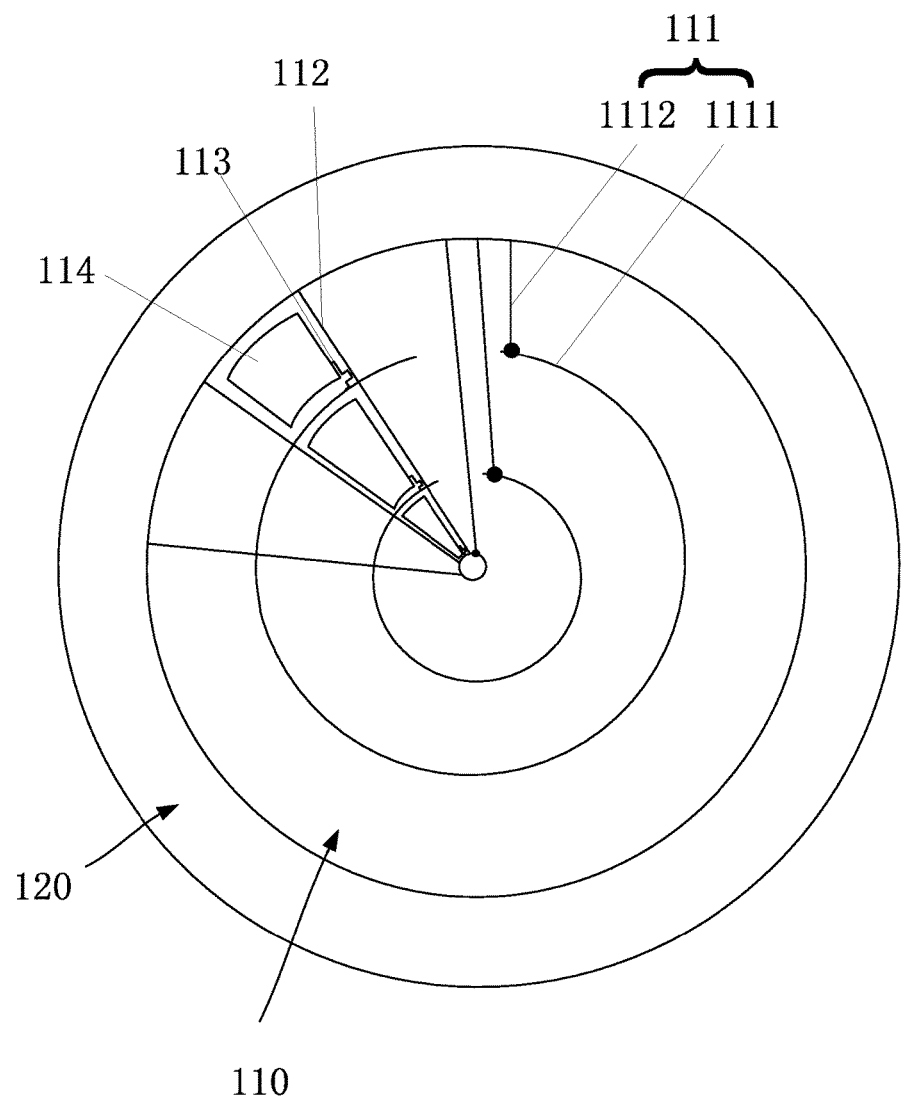
FIG. 3 is a structural schematic diagram of an array substrate according to a third embodiment of the present disclosure.

Referring to FIG. 3, FIG. 3 is a structural schematic diagram of an array substrate according to a third embodiment of the present disclosure. It should be noted that, the third embodiment differs from the first embodiment in that: the display region 110 is located at a central region of the base substrate and the non-display region 120 is located at the periphery of the display region 110. While in the first embodiment, the non-display region of the base substrate is located at the central region and the display region is located at the periphery of the non-display region.

In the embodiment, the first portion 1111 of each of the first signal lines 111 in addition to the first signal line 111 farthest from the non-display region 120 (an innermost first signal line 111 according to the embodiment) is a circular arc having an opening, while the first portion 1111 of the first signal line 111 farthest from the non-display region 120 is a complete circular arc (i.e., a whole circle). For each first signal line 111 in addition to the first signal line 111 closest to the non-display region, a second portion 1112 of one first signal line 111 passes through the openings of the circular arcs of the other first signal lines 111 located closer to the non-display region than the one first signal line 111 and is then connected to the connection wire, wherein the openings are located at a side of the non-display region.

An advantage of the embodiment is that, the central region of the array substrate can display contents.

It should be noted that, in the third embodiment, features substantially identical to those described in the first embodiment as shown in FIG. 1 are not described herein. That is, only differences between the first embodiment and the third embodiment are described, while similar parts can be understood with reference to corresponding descriptions in the first embodiment and are accordingly not described herein.

Fourth Embodiment

Figure 4:
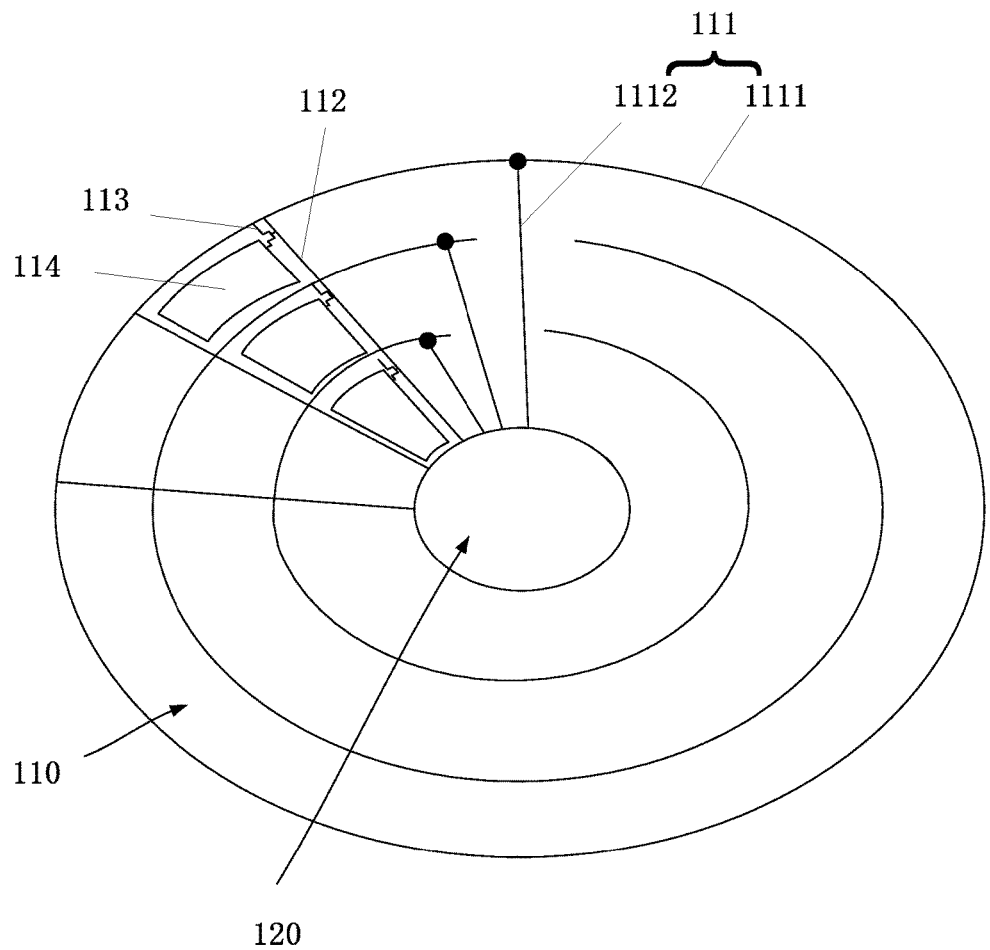
FIG. 4 is a structural schematic diagram of an array substrate according to a fourth embodiment of the present disclosure.

Referring to FIG. 4, FIG. 4 is a structural schematic diagram of an array substrate according to a fourth embodiment of the present disclosure. It should be noted that, different from the first embodiment, in the fourth embodiment, the horizontal section of the base substrate is oval. In addition, the first portions 1111 of the first signal lines 111 are oval and are arranged concentrically. Since the horizontal section of the base substrate is oval, the first portions 1111 of the first signal lines 111 may alternatively be concentric with the horizontal section of the base substrate, thereby the area of the base substrate can be used sufficiently.

In the embodiment, the first portion 1111 and the second 1112 of the first signal line 111 are created from an identical layer. Accordingly, the first portion 1111 and the second portion 1112 can be formed by one patterning process, thereby the cost is saved. The first signal line 111 is usually made of a metallic material.

In order to prevent the plurality of first signal lines 111 from overlapping each other, in the embodiment, the first portion 1111 of each of the first signal lines 111 in addition to the first signal line 111 farthest from the non-display region 120 (an outmost first signal line 111 according to the embodiment) is an oval arc having an opening, while the first portion 1111 of the first signal line 111 farthest from the non-display region 120 is a complete oval arc (i.e., a whole oval). Of course, in other embodiments of the present disclosure, the first signal line 111 farthest from the non-display region may also be an oval arc having an opening. For each first signal line 111 in addition to the first signal line 111 closest to the non-display region, the second portion 1112 of one first signal line 111 passes through the openings of the oval arcs of the other first signal lines 111 located closer to the non-display region 120 than the one first signal line and is then connected to the connection wire, wherein the openings are located at a side of the non-display region. The openings of the first portions 1111 of the respective first signal lines 111 are arranged at positions corresponding to each other, so as to improve the aperture ratio.

It should be noted that, in the fourth embodiment, features substantially identical to those described in the first embodiment as shown in FIG. 1 are not repeated herein. That is, only differences between the first embodiment and the fourth embodiment are described, while similar parts can be understood with reference to corresponding descriptions in the first embodiment and are accordingly not described herein.

Fifth Embodiment

Figure 5:
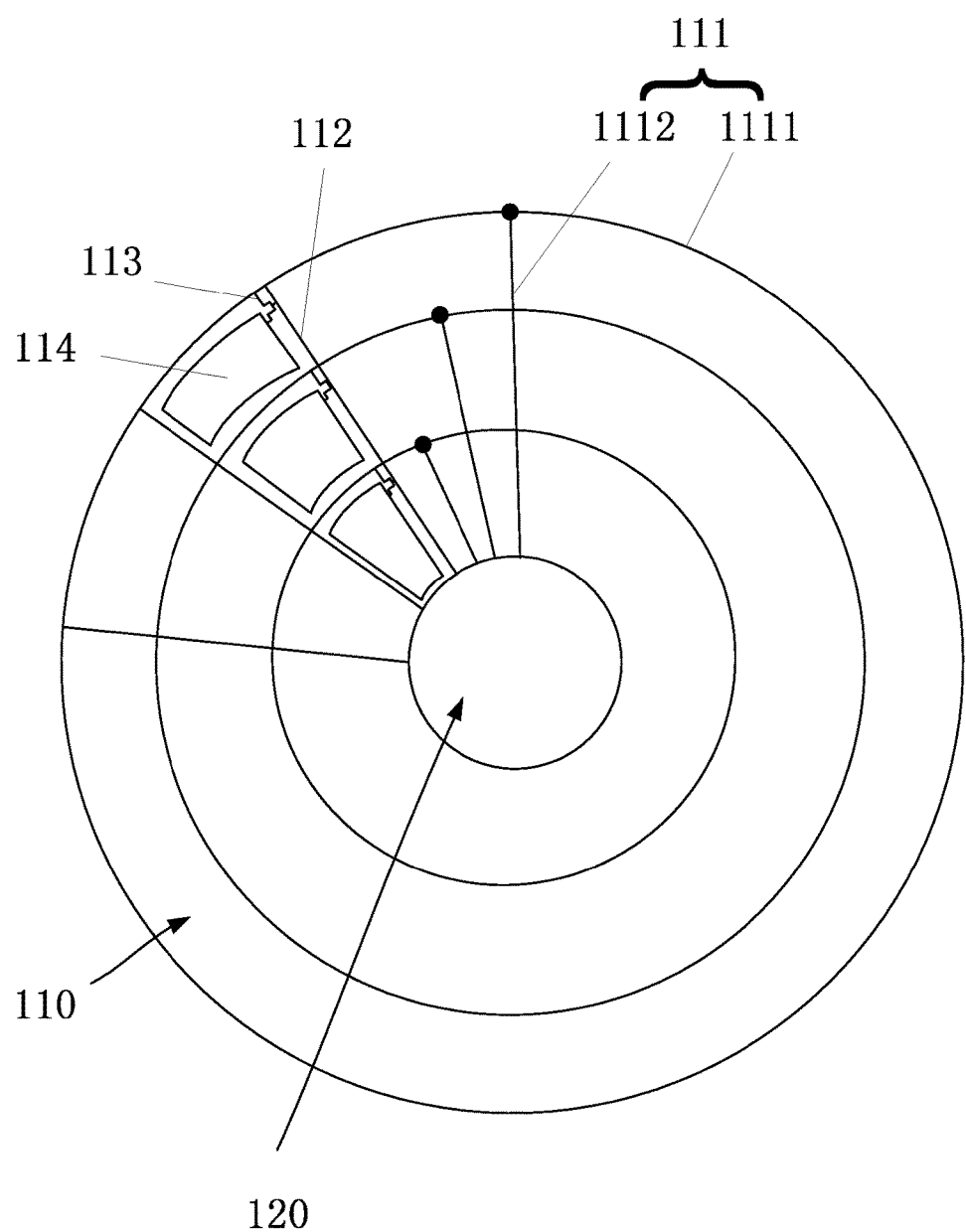
FIG. 5 is a structural schematic diagram of an array substrate according to a fifth embodiment of the present disclosure.

Referring to FIG. 5, FIG. 5 is a structural schematic diagram of an array substrate according to a fifth embodiment of the present disclosure. It should be noted that, the fifth embodiment differs from the first embodiment in that: the first portion 1111 and the second portion 1112 of each first signal line 111 are arranged at different layers, insulated from each other, and connected each other through a via-hole. While in the first embodiment, the first portion 1111 and the second portion 1112 of each first signal line 111 are created from an identical layer.

By arranging the first portion 1111 and the second portion 1112 at different layers, there is no need to design the first portion 1111 of each first signal line 111 into a circular arc having an opening, and all the first portions 1111 can be whole circles.

In the embodiment, the second portions 1112 and the gate lines 112 may be created from an identical layer, so that the second portions 1112 and the gate lines 112 can be formed by one patterning process, thereby the cost is saved.

It should be noted that, in the fifth embodiment, features substantially identical to those described in the first embodiment as shown in FIG. 1 are not described herein. That is, only differences between the first embodiment and the fifth embodiment are described, while similar parts can be understood with reference to corresponding descriptions in the first embodiment and are accordingly not described herein.

Sixth Embodiment

Figure 6:
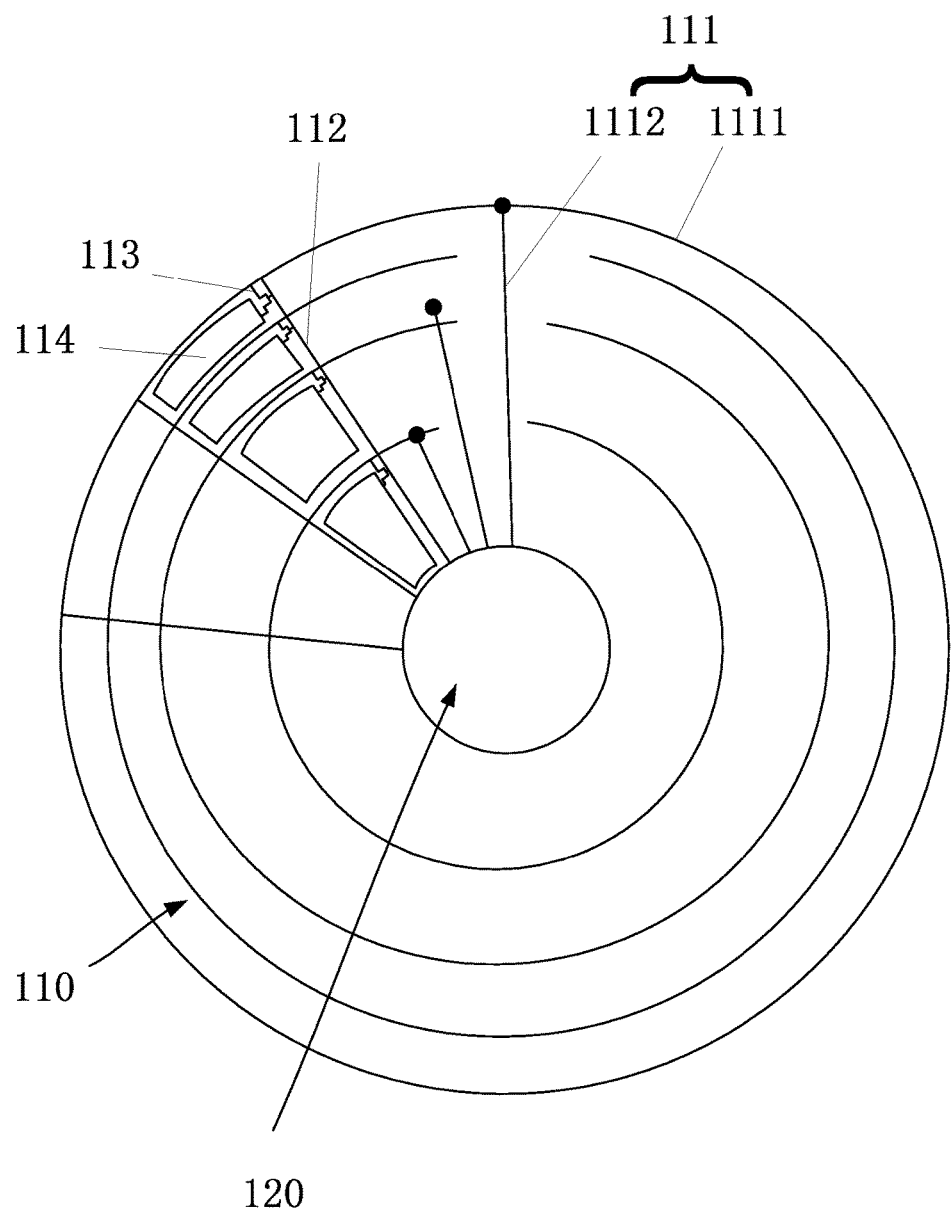
FIG. 6 is a structural schematic diagram of an array substrate according to a sixth embodiment of the present disclosure.

Referring to FIG. 6, FIG. 6 is a structural schematic diagram of an array substrate according to a sixth embodiment of the present disclosure. It should be noted that, the sixth embodiment differs from the first embodiment in that: a distribution density of the first portions 1111 of the plurality of first signal lines 111 is gradually increased in a direction from the center to the periphery of the base substrate. That is to say, the interval between any two adjacent first portions 1111 is gradually decreased from the center to the periphery of the base substrate. However, in the first embodiment, the first portions 1111 of the plurality of first signal lines 111 are distributed at an identical interval.

In the embodiment, since the distribution density of the first portions 1111 of the first signal lines 111 is gradually increased, all the pixel electrodes 114 can be designed with an identical size.

It should be noted that, in the sixth embodiment, features substantially identical to those described in the first embodiment as shown in FIG. 1 are not described herein. That is, only differences between the first embodiment and the sixth embodiment are described, while similar parts can be understood with reference to corresponding descriptions in the first embodiment and are accordingly not described herein.

Seventh Embodiment

Figure 7:
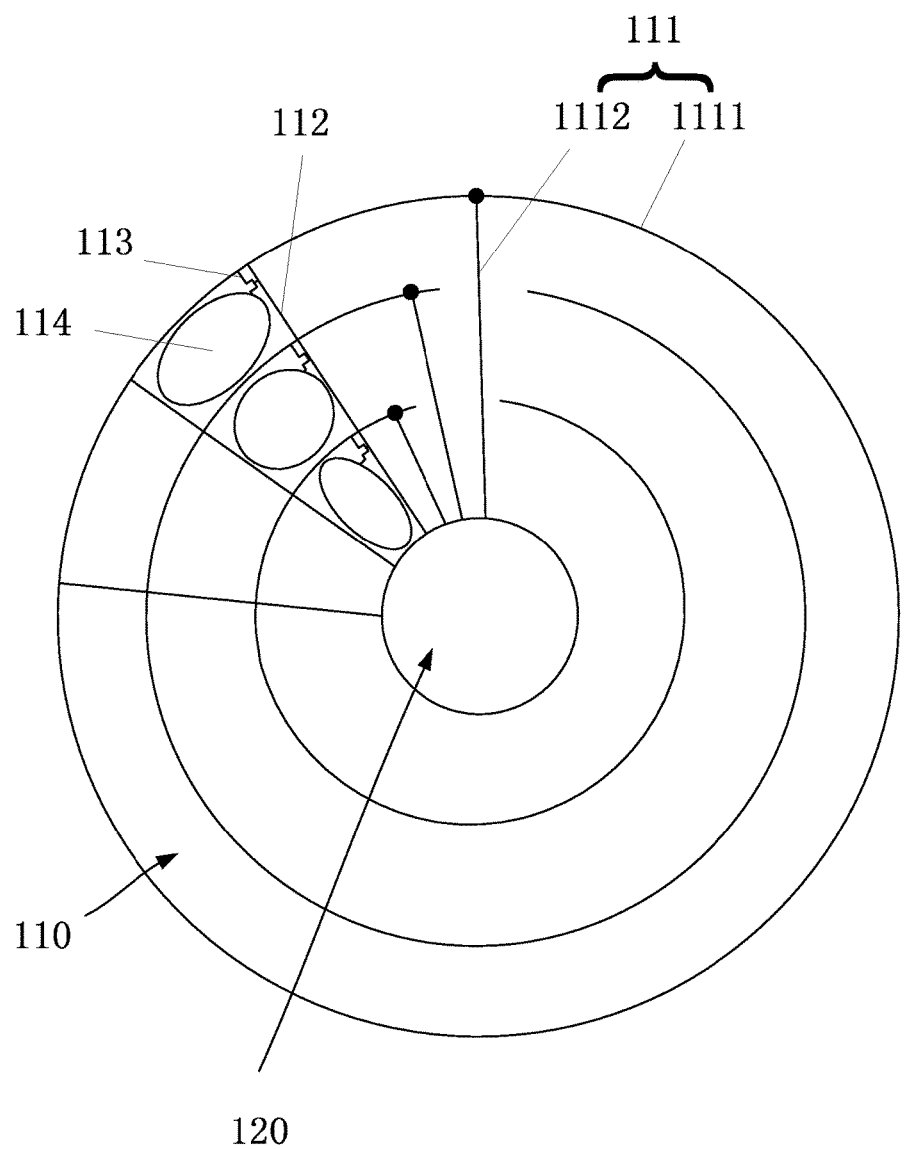
FIG. 7 is a structural schematic diagram of an array substrate according to a seventh embodiment of the present disclosure.

Referring to FIG. 7, FIG. 7 is a structural schematic diagram of an array substrate according to a seventh embodiment of the present disclosure. It should be noted that, the seventh embodiment differs from the first embodiment in that: each pixel electrode 114 has an oval shape.

In some other embodiments of the present disclosure, each pixel electrode 114 can also has a circular shape.

It should be noted that, in the seventh embodiment, features substantially identical to those described in the first embodiment as shown in FIG. 1 are not described herein. That is, only differences between the first embodiment and the seventh embodiment are described, while similar parts can be understood with reference to corresponding descriptions in the first embodiment and are accordingly not described herein.

Other Embodiments

According to the foregoing embodiments, each second signal line 112 extends from one point at the periphery of the display region 110 to the center of the base substrate. That is to say, extended lines of the second signal lines 112 all pass through the center of the base substrate. In some other embodiments of the present disclosure, each second signal line 112 extends from one point at the periphery of the display region 110 to a central region of the base substrate, but the extended line of the second signal line 112 does not pass through the center of the base substrate.

According to some embodiments of the present disclosure, the features described in the foregoing embodiments can be combined, which is not detailed herein.

The present disclosure further provides a display device, which includes the array substrate according to any of the foregoing embodiments.

The present disclosure further provides a wearable apparatus including the above-mentioned display device. The wearable apparatus may be a smart watch, a wristband, etc.

It is appreciated that the above are merely the preferred embodiments of the present disclosure for illustrating the principle of the present disclosure, and the present disclosure is not limited thereto. A person skilled in the art may make further modifications and improvements without departing from the principle and the spirit of the present disclosure, and these modifications and improvements shall also fall within the scope of the present disclosure.

What is claimed is:

1. An array substrate, comprising a base substrate having a circular or oval horizontal section,
wherein the base substrate comprises a display region and a non-display region,
wherein a plurality of first signal lines, a plurality of second signal lines crossing the plurality of first signal lines, a plurality of thin film transistors and a plurality of pixel electrodes are arranged in the display region, and the plurality of thin film transistors and the plurality of pixel electrodes are arranged in a plurality of pixel regions defined by the plurality of first signal lines and the plurality of second signal lines;

wherein a connection wire connected to the plurality of first signal lines and the plurality of second signal lines is arranged in the non-display region;

wherein each of the plurality of first signal lines comprises a first portion and a second portion, the first portion is a circular arc or an oval arc and the second portion is configured to connect the first portion to the connection wire;

wherein the first portions of the plurality of first signal lines are arranged concentrically, and each of the plurality of second signal lines extends from a point at an outer edge of the display region to a central region of the base substrate; and wherein the first portions and the second portions of the plurality of first signal lines are created from an identical layer, and the second portion of one first signal line passes through openings of circular arcs or oval arcs of other first signal lines located closer to the non-display region than the one first signal line and is then connected to the connection wire, wherein the openings are located at a side of the non-display region.

2. The array substrate according to claim 1, wherein the first portions of the plurality of first signal lines are distributed at an identical interval; or a distribution density of the first portions of the plurality of first signal lines is gradually increased in a direction from a center to a periphery of the base substrate.

3. The array substrate according to claim 1, wherein the first portion of each of the first signal lines in addition to the first signal line farthest from the non-display region is a circular arc or an oval arc having an opening.

4. The array substrate according to claim 1, wherein the openings of the first portions of the first signal lines are arranged at positions corresponding to each other.

5. The array substrate according to claim 1, wherein each of the plurality of second signal lines extends from a point at the outer edge of the display region to the center of the base substrate.

6. The array substrate according to claim 1, wherein the plurality of second signal lines is distributed evenly.

7. The array substrate according to claim 6, wherein in the pixel regions between any two adjacent second signal lines, areas of the pixel electrodes are gradually increased in a direction from the center to the periphery of the base substrate.

8. The array substrate according to claim 1, wherein each of the plurality of pixel electrodes is a circular, oval or near-quadrilateral shape.

9. The array substrate according to claim 8, wherein in the case that each of the plurality of pixel electrodes is of a near-quadrilateral shape, the near-quadrilateral shape comprises a first edge and a third edge opposite to each other, and a second edge and a fourth edge opposite to each other, wherein the first edge and the third edge are arcs and are concentric with the first signal lines adjacent to the first edge and the third edge, the second edge and the fourth edge are straight and are respectively parallel to the second signal lines adjacent to the second edge and the fourth edge.

10. The array substrate according to claim 1, wherein the non-display region is located in a central region of the array substrate and the display region is located at the periphery of the non-display region.

11. The array substrate according to claim 1, wherein the non-display region is located in a peripheral region of the array substrate and the display region is surrounded by the non-display region.

12. A display device, comprising the array substrate according to claim 1.

13. A wearable apparatus, comprising the display device according to claim 12.

14. The array substrate according to claim 1, wherein the first portions and the second portions of the plurality of first signal lines are created from an identical layer, and the second portion of one first signal line passes through openings of circular arcs or oval arcs of other first signal lines located closer to the non-display region than the one first signal line and is then connected to the connection wire, wherein the openings are located at a side of the non-display region.

15. The array substrate according to claim 3, wherein the openings of the first portions of the first signal lines are arranged at positions corresponding to each other.

16. An array substrate, comprising a base substrate having a circular or oval horizontal section, wherein the base substrate comprises a display region and a non-display region, wherein a plurality of first signal lines, a plurality of second signal lines crossing the plurality of first signal lines, a plurality of thin film transistors and a plurality of pixel electrodes are arranged in the display region, and the plurality of thin film transistors and the plurality of pixel electrodes are arranged in a plurality of pixel regions defined by the plurality of first signal lines and the plurality of second signal lines;

wherein a connection wire connected to the plurality of first signal lines and the plurality of second signal lines is arranged in the non-display region;

wherein each of the plurality of first signal lines comprises a first portion and a second portion, the first portion is a circular arc or an oval arc and the second portion is configured to connect the first portion to the connection wire;

wherein the first portions of the plurality of first signal lines are arranged concentrically, and each of the plurality of second signal lines extends from a point at an outer edge of the display region to a central region of the base substrate;

wherein the first portion of each of the first signal lines in addition to the first signal line farthest from the non-display region is a circular arc or an oval arc having an opening; and wherein the openings of the first portions of the first signal lines are arranged at positions corresponding to each other.

* * * * *